(12) United States Patent
Heiser et al.

(10) Patent No.: US 11,287,705 B2
(45) Date of Patent: Mar. 29, 2022

(54) LIQUID CRYSTAL SPATIAL LIGHT MODULATOR

(71) Applicants: UNIVERSITE DE STRASBOURG, Strasbourg (FR); CENTRE NATIONAL DE LA RECHERCHE SCIENTIFIQUE, Paris (FR); UNIVERSITY OF SOUTHAMPTON, Southampton (GB)

(72) Inventors: Thomas M. Heiser, Hochfelden (FR); Thomas M. Regrettier, Strasbourg (FR); Malgosia Kaczmarek, Southampton (GB)

( * ) Notice: Subject to any disclaimer, the term of this patent is extended or adjusted under 35 U.S.C. 154(b) by 0 days.

(21) Appl. No.: 16/637,176

(22) PCT Filed: Jul. 19, 2018

(86) PCT No.: PCT/EP2018/069597
§ 371 (c)(1),
(2) Date: Feb. 6, 2020

(87) PCT Pub. No.: WO2019/034359
PCT Pub. Date: Feb. 21, 2019

(65) Prior Publication Data
US 2020/0233248 A1    Jul. 23, 2020

(30) Foreign Application Priority Data

Aug. 17, 2017 (EP) .................................. 17186647

(51) Int. Cl.
*G02F 1/135* (2006.01)
*G02F 1/137* (2006.01)
(Continued)

(52) U.S. Cl.
CPC ............ *G02F 1/1354* (2013.01); *G02F 1/137* (2013.01); *H01L 27/305* (2013.01); *H01L 51/4253* (2013.01); *G02F 2203/12* (2013.01)

(58) Field of Classification Search
CPC .... G02F 1/1354; G02F 1/137; G02F 2203/12; H01L 27/305; H01L 51/4253
(Continued)

(56) References Cited

U.S. PATENT DOCUMENTS 5,841,489 A    11/1998  Yoshida et al.
6,233,027 B1    5/2001  Unno et al.
(Continued)

OTHER PUBLICATIONS

European application 17186647.8 search report and written opinion dated Feb. 2, 2018.
(Continued)

*Primary Examiner* — Charles S Chang
(74) *Attorney, Agent, or Firm* — Anglehart et al.

(57) ABSTRACT

The invention concerns a liquid crystal spatial light modulator (101) comprising: a liquid crystal layer (7); and on at least one side of the liquid crystal layer (7), at least one photovoltaic cell (456), each photovoltaic cell (456) comprising a photosensitive layer (5) comprising electron-donating (D) molecules and electron accepting (A) molecules, each photovoltaic cell (456) being arranged for spontaneous photovoltage under illumination. Electron-donating molecules and electron accepting molecules are preferably blended and form preferably an organic bulk heterojunction layer. The photosensitive layer (5) of each photovoltaic cell (456) is preferably comprised between: —an electron conducting layer (4) arranged for a transfer of an electron from its contacting photosensitive layer (5) easier than a transfer of an electron hole from its contacting photosensitive layer (5), and —an electron hole conducting layer (6) arranged for a transfer of an electron hole from its contacting photosensitive layer (5) easier than a transfer of an electron from its contacting photosensitive layer (5).

24 Claims, 3 Drawing Sheets

(51) Int. Cl.
*H01L 27/30* (2006.01)
*H01L 51/42* (2006.01)

(58) Field of Classification Search
USPC .................................................. 349/24–31
See application file for complete search history.

(56) References Cited

U.S. PATENT DOCUMENTS

| | | | |
|---|---|---|---|
| 2011/0285942 A1* | 11/2011 | Guo | G02B 5/288 349/96 |
| 2014/0028957 A1 | 1/2014 | Yang et al. | |
| 2016/0260919 A1 | 9/2016 | Ballarino et al. | |

OTHER PUBLICATIONS

International application No. PCT/EP2018/069597 International Search Report dated Oct. 30, 2018.
International application No. PCT/EP2018/069597 Search Strategy dated Oct. 30, 2018.
International application No. PCT/EP2018/069597 Written Opinion of the International Searching Authority dated Oct. 30, 2018.
L. Lucchetti; K. Kushnir; A. Zaltron; F. Simoni : «Liquid crystal cells based on photovoltaic substrates», Eur. Opt. Soc.—Rapid, vol. 11, 2016, p. 16007, XP055442876.

* cited by examiner

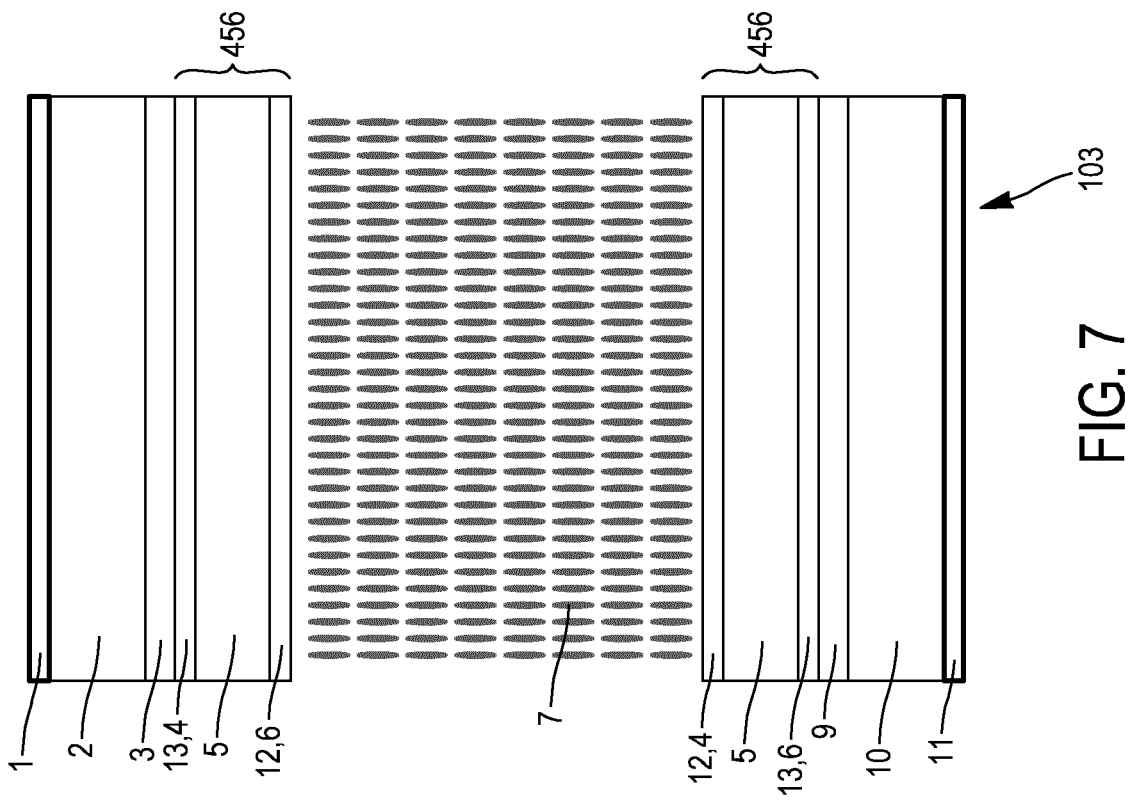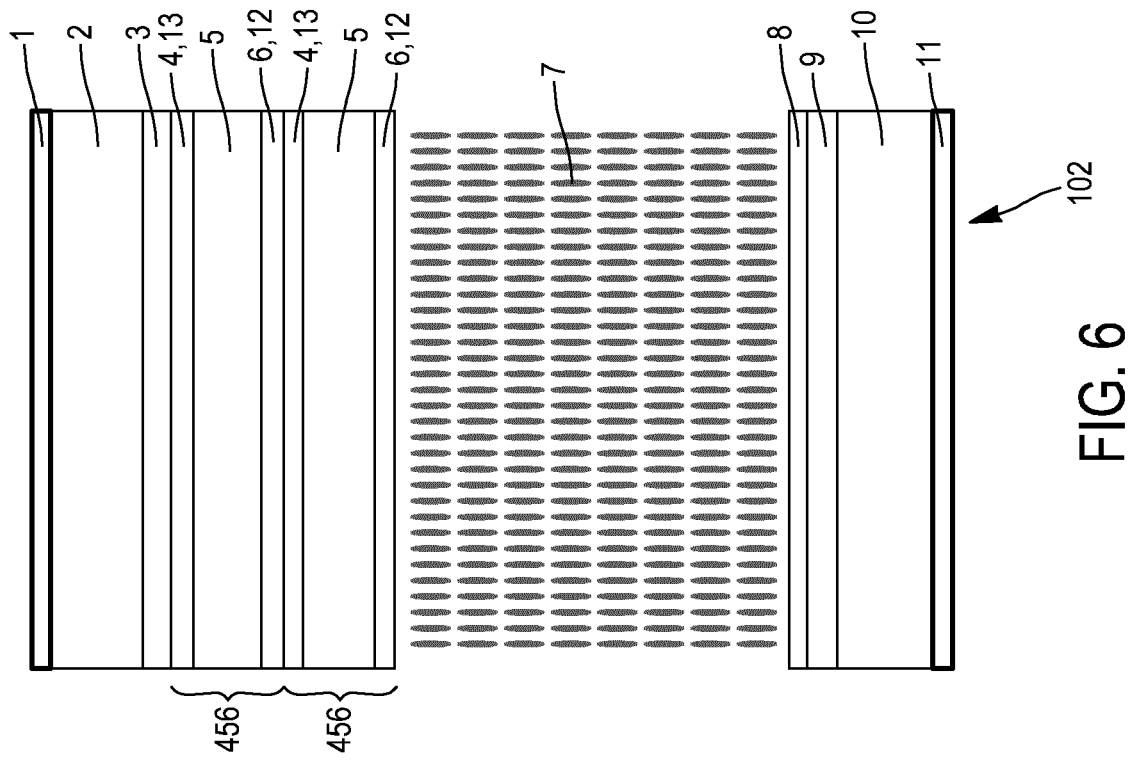

LIQUID CRYSTAL SPATIAL LIGHT MODULATOR

TECHNICAL FIELD

The present invention relates to a liquid crystal spatial light modulator.

STATE OF THE ART

Article "Liquid crystal cells based on photovoltaic substrates" by L. Lucchetti, K. Kushnir, A. Zaltron and F. Simoni (Eur. Opt. Soc.-rapid 11, 16007 (2016)) describes a liquid crystal cell with $LiNbO_3$:Fe crystals as substrates. Without application of an external electric field, the photovoltaic $LiNbO_3$:Fe crystal substrates is able to change the orientation of the liquid crystal director thus giving rise to a phase shift on the light propagating through the cell. The problems of this device according to prior art are that:
- the device is thick due to the thickness of the $LiNbO_3$:Fe crystal substrates,
- the device is difficult to implement on a large surface due to the manufacturing process of the $LiNbO_3$:Fe crystal substrates and due to the brittleness of the $LiNbO_3$:Fe crystal substrates, and
- the device is breakable due to the fragility of the $LiNbO_3$:Fe crystal substrates.
- the device has a low sensitivity to the incident light (birefringence $\Delta n_{max}=0.1$ at a light intensity of 10 $W/cm^2$)

The goal of the invention is to present a liquid crystal spatial light modulator solving at least one of the above problems.

SUMMARY OF THE INVENTION

An aspect of the invention concerns a liquid crystal spatial light modulator comprising:
- a liquid crystal layer,
- on at least one side of the liquid crystal layer, at least one photovoltaic cell, each photovoltaic cell comprising a photosensitive layer comprising electron-donating molecules and electron accepting molecules, each photovoltaic cell being arranged for spontaneous photovoltage under illumination.

Electron-donating molecules and electron accepting molecules can be blended and can form a bulk heterojunction layer. By "blended", it is meant that electron-donating molecules and electron accepting molecules are in a blended state.

The electron-donating molecules are preferably organic electron-donating molecules.

The electron accepting molecules are preferably organic electron accepting molecules.

The at least one photovoltaic cell can comprise, on at least one side of the liquid crystal layer, a superposition of a plurality of photovoltaic cells.

The spatial light modulator according to the invention can comprise, on each side of the liquid crystal layer, at least one photovoltaic cell.

That the or each or at least one photovoltaic cell can further comprise an inside interface layer, this inside interface layer:
- being in contact with the photosensitive layer of this photovoltaic cell, this inside interface layer being located between the liquid crystal layer and this photosensitive layer, or
- being the liquid crystal layer.

The inside interface layer can be an electron hole conducting layer arranged for a transfer of electron holes from its contacting photosensitive layer easier than a transfer of electrons from its contacting photosensitive layer.

The inside interface layer of the or one of the photovoltaic cell(s):
- can be in contact with the liquid crystal layer, the inside interface layer being arranged for aligning the liquid crystal of the liquid crystal layer at the interface between this inside interface layer and the liquid crystal layer, or
- can be the liquid crystal layer, the photosensitive layer of this photovoltaic cell being arranged for aligning the liquid crystal of the liquid crystal layer at the interface between this photosensitive layer and the liquid crystal layer.

The inside interface layer:
- can be in contact with the liquid crystal layer, and can be hydrophobic, or
- can be the liquid crystal layer, and the photosensitive layer of this photovoltaic cell can be hydrophobic.

A layer is considered as "hydrophobic" preferably if the contact angle of a water droplet deposited on this layer is higher than 90° (for a temperature of 20° C. and a pressure of air surrounding the droplet equal to 1 bar).

The or each or at least one photovoltaic cell can further comprise an outside interface layer in contact with the photosensitive layer of this photovoltaic cell, this photosensitive layer being located between the liquid crystal layer and this outside interface layer.

The outside interface layer can be an electron conducting layer arranged for a transfer of electron from its contacting photosensitive layer easier than a transfer of electron holes from its contacting photosensitive layer.

The or each or at least one photovoltaic cell can comprise both of:
- the inside interface layer as previously described,
- the outside interface layer as previously described, the inside interface layer in contact with a given photosensitive layer and the outside interface layer in contact with the same given photosensitive layer being preferably made of different materials.

Preferably:
- one among the inside interface layer and the outside interface layer can be an electron hole conducting layer arranged for a transfer of an electron hole from its contacting photosensitive layer easier than a transfer of an electron from its contacting photosensitive layer, and
- the other one among the inside interface layer and the outside interface layer can be an electron conducting layer arranged for a transfer of an electron from its contacting photosensitive layer easier than a transfer of an electron hole from its contacting photosensitive layer.

The absolute value of the energy difference between the work function of the electron conducting layer and the electron affinity of each electron accepting molecule of the photosensitive layer contacting this outside interface layer is preferably less than or equal to 0.2 eV.

The absolute value of the energy difference between the work function of the electron hole conducting layer and the ionization potential of each electron-donating molecule of the photosensitive layer contacting this inside interface layer is preferably less than or equal to 0.2 eV.

The liquid crystal layer preferably has an electrical resistance higher than each part of the photovoltaic cell(s).

The energy difference between the electron affinity and the ionization potential of each electron-donating molecule is preferably higher than or equal to 3 eV.

The energy difference between the electron affinity and the ionization potential of each electron accepting molecule is preferably higher than or equal to 3 eV.

The energy difference between the electron affinity of the electron-donating molecules and the electron affinity of the electron accepting molecules is preferably higher than or equal to 0.1 eV, preferably higher than or equal to 0.3 eV, per couple of electron-donating molecule and electron accepting molecule.

The energy difference between the ionization potential of the electron-donating molecules and the ionization potential of the electron accepting molecules is preferably higher than or equal to 0.1 eV, preferably higher than or equal to 0.3 eV, per couple of electron-donating molecule and electron accepting molecule.

The energy difference between the electron affinity of the electron accepting molecules and the ionization potential of the electron-donating molecules, per couple of electron-donating molecule and electron accepting molecule, can respect the following equation:

$$IE(D) - EA(A) \gtrsim V(\text{Fredericks}) \times e + 0.3$$

where:
EA(A) is the electron affinity of each electron accepting molecule expressed in eV
IE(D) is the ionization potential of each electron-donating molecule expressed in eV
V(Fredericks) is the Fredericks threshold voltage, expressed in V, of the crystal liquid of the crystal liquid layer
e is the elementary charge of an electron expressed in C.

The ionization potential of each electron-donating molecule is preferably higher than or equal to 5 eV.

The electronic affinity of each electron accepting molecule is preferably higher than or equal to 3.5 eV.

The liquid crystal layer and the at least one photovoltaic cell can be comprised between two polarizers.

The thickness of each photovoltaic cell is preferably less than 1 µm.

Electron-donating molecules and electron accepting molecules preferably differ in their chemical structure.

BRIEF DESCRIPTION OF THE DRAWINGS

Other advantages and characteristics of the invention will appear upon examination of the detailed description of embodiments which are in no way limitative, and of the appended drawings in which:

FIG. 4 illustrates the birefringence variation of two OASLMs (Optically-addressed Spatial Light Modulator) with an organic photosensitive layer 5. The curves represent the variation of birefringence (difference between the birefringence measured at a light intensity of 89 mW/cm2 and a light intensity of 0.017 mW/cm2 at a wavelength of 532 nm as a function of the applied voltage between electrodes 3, 9, wherein:

Figure 1:
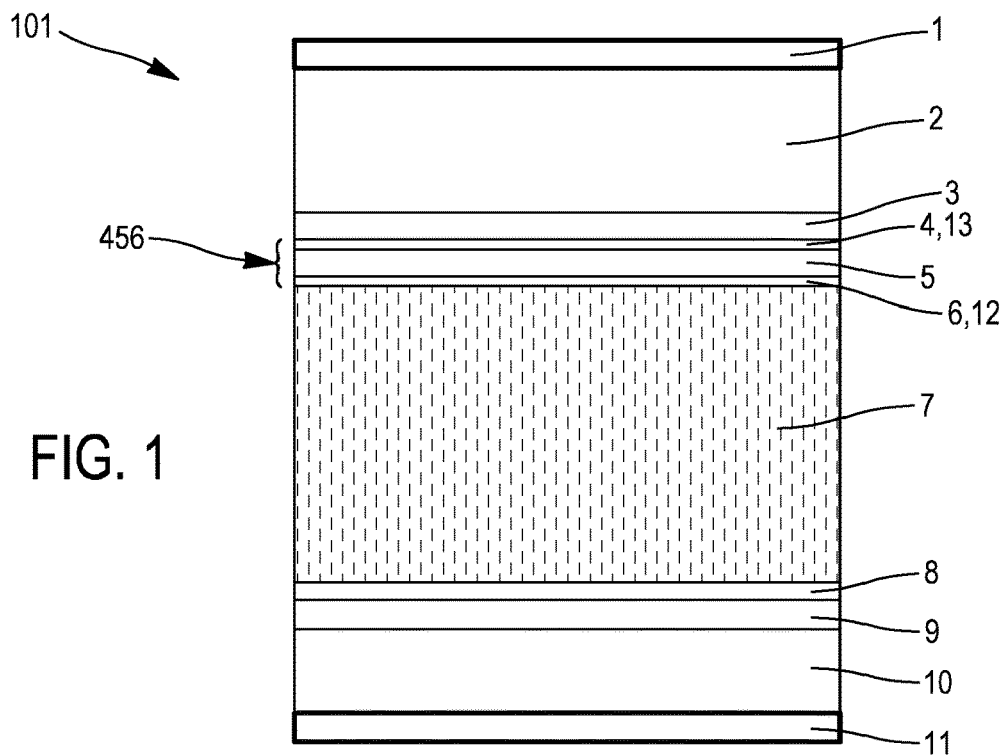
FIG. 1 is a side view of a part of a first embodiment 101 of a spatial light modulator according to the invention.

curve 16 corresponds to the first embodiment of FIG. 1, and curve 17 corresponds to a variant (without layer 6, 12) of the first embodiment of FIG. 1

Figure 5:
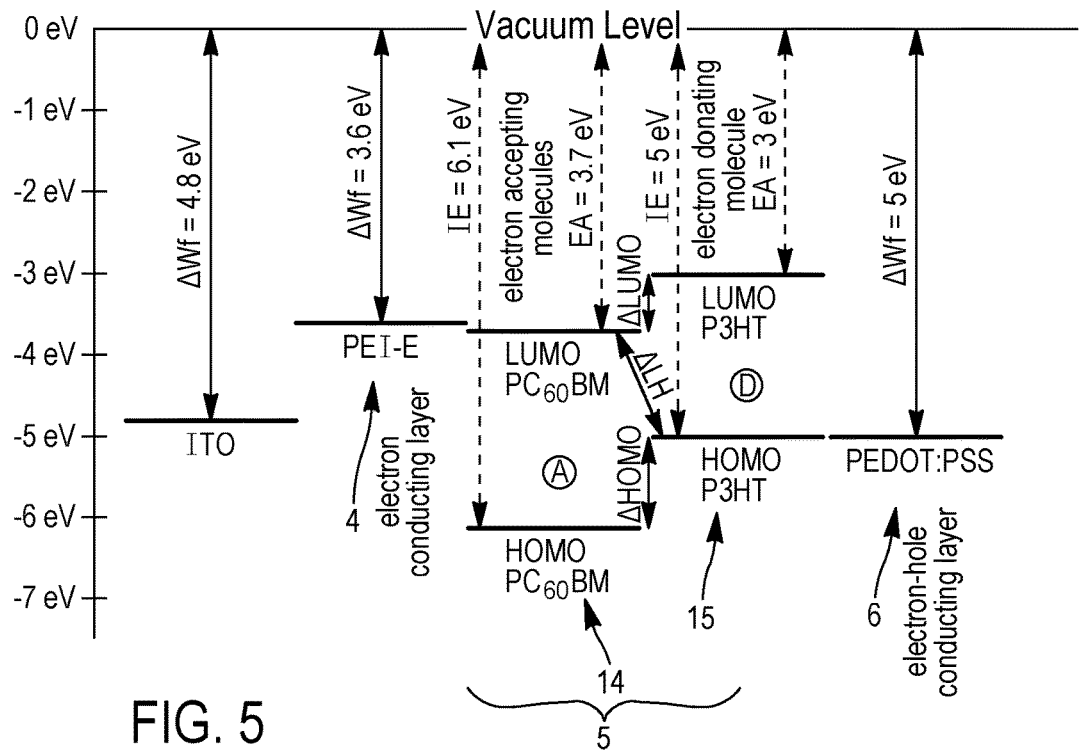

FIG. 5 is a schematic view of the electron affinity and/or ionization potential and/or work function of different layers 4, 6 or molecules 14, 15, FIG. 6 is a side view of a part of a second embodiment 102 of a spatial light modulator according to the invention, and FIG. 7 is a side view of a part of a third embodiment 103 of a spatial light modulator according to the invention.

DETAILED DESCRIPTION

These embodiments being in no way limitative, we can consider variants of the invention including only a selection of characteristics subsequently described or illustrated, isolated from other described or illustrated characteristics (even if this selection is taken from a sentence containing these other characteristics), if this selection of characteristics is sufficient to give a technical advantage or to distinguish the invention over the state of the art. This selection includes at least one characteristic, preferably a functional characteristic without structural details, or with only a part of the structural details if that part is sufficient to give a technical advantage or to distinguish the invention over the state of the art.

We are now going to describe, in reference to FIGS. 1 to 5, a first embodiment 101 of a spatial light modulator according to the invention.

This first embodiment 101 is an Optically-Addressed Spatial Light Modulator (OASLM), more particularly an optically addressed liquid crystal spatial light modulator 101.

Modulator 101 is a new generation of a liquid-crystal optically addressed spatial light modulator (OASLM) that harvests incident light as a source of energy for operating without an external power supply.

The modulator 101 comprises:
a layer 7 of liquid crystal (also called LC),
on at least one side of the liquid crystal layer 7, at least one photovoltaic cell 456.

The liquid crystal of layer 7 is a nematic liquid crystal.

The liquid crystal of layer 7 is a liquid crystal mixture consisting of several cyanobiphenyls with long aliphatic tails, known as "E7". The E7 liquid crystal used here is the classical E7 comprising the following percentages of the following molecules:

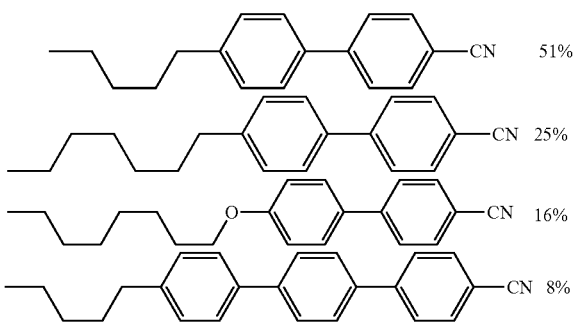

The thickness of layer 7 is more than 1 µm, typically more than 2 µm and/or less than 100 µm, preferably from 3 to 25 microns, typically around 8 µm.

Figure 2:
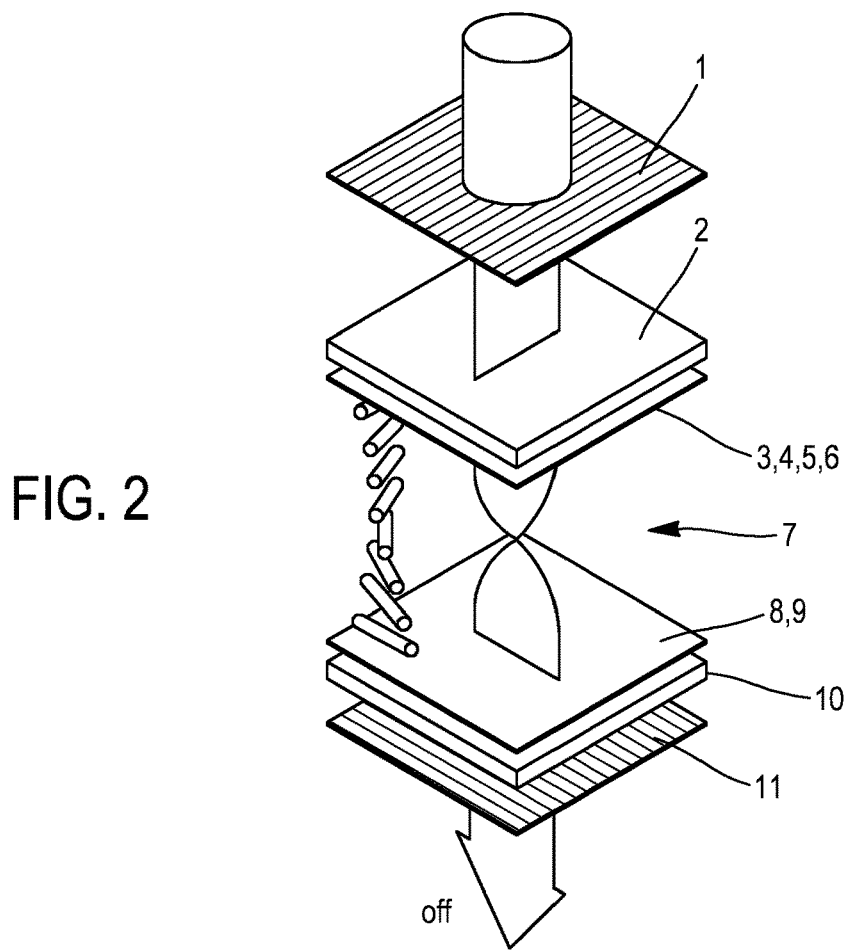
FIG. 2 is a perspective view of a part of the first embodiment of a spatial light modulator according to the invention.

FIGS. 1 and 2 illustrate the particular case comprising only one cell 456.

Each photovoltaic cell 456 is a photovoltaic diode.

Each photovoltaic cell 456 comprises a photosensitive layer 5 comprising electron-donating molecules D and electron accepting molecules A.

The thickness of layer 5 is less than 500 nm, typically around 100 nm.

The electron-donating molecules D (also reference number 15 on the figures) and electron accepting molecules A (also reference number 14 on the figures) are conjugated.

Electron-donating molecules D and electron accepting molecules A differ in their chemical structure.

In layer 5, the mass ratio is 1 mg of electron-donating molecules D, 15 for between 0.8 to 1.2 mg of electron accepting molecules A, 14, preferably 1 mg of electron-donating molecules D, 15 for between 0.9 to 1.1 mg of electron accepting molecules A, 14, more preferably 1 mg of electron-donating molecules D, 15 for between 0.99 to 1.01 mg of electron accepting molecules A.

The photosensitive layer 5 does not comprise any solvent for molecules A and D.

The photosensitive layer 5 is composed only of the electron-donating molecules D and the electron accepting molecules A.

The photosensitive layer 5 consist only of the electron-donating molecules D and the electron accepting molecules A and comprises nothing else.

The electron-donating molecules D are organic semiconductor molecules.

The electron-donating molecules D comprise several copies of only one type of electron-donating molecule (here P3HT).

The electron-donating molecules D, 15 are molecules of poly(3-hexylthiophene-2,5-diyl) electron-donating polymer also called P3HT (>93% regioregular, Solaris Chem).

The electron accepting molecules A are organic semiconductor molecules.

The electron accepting molecules A comprise several copies of only one type of electron accepting molecule (here PCBM).

The electron accepting molecules A, 14 are molecules of fullerene derivative [6,6]-phenyl-C61-butyric acid methyl ester also called PCBM (Solenne BV).

Each photovoltaic cell 456 is arranged for spontaneous photovoltage under illumination. As used herein, the term "illumination" refers to any electromagnetic emission. In some embodiments, an illumination may be within the range of infrared, visible and/or ultraviolet spectrum. In some embodiments, it may be advantageous to use an illumination in the range of infrared (IR) or near-infrared (NIR). In some embodiments, it may be advantageous to use an illumination in the range of ultraviolet (UV). In some embodiments, it may be advantageous to use an illumination in the range of visible spectrum. For purposes of this disclosure, visible range wavelengths are considered to be from 350 nm to 800 nm, near-infrared and infraredwavelengths are considered to be longer than 800 nm (preferably up to 1.4 µm) and ultraviolet wavelengths are considered to be shorter than 350 nm (preferably from 10 nm). Each photovoltaic cell 456 is preferably arranged for spontaneous photovoltage of an electrical potential of at least 0.6 Volt (or even at least 0.7 Volt) under an illumination of 100 mW/cm$^2$ for at least one wavelength comprised between 350 nm and 600 nm (or more generally between 10 nm and 1.4 µm).

By spontaneous, it is meant in the present description that each photovoltaic cell 456 is arranged for photovoltage under illumination of this photovoltaic cell 456, even at a zero bias voltage between the electrodes 3, 9 and/or even without the existence of electrode 3 and/or 9 and/or even at an initial zero bias voltage through this photovoltaic cell 456.

Typically, each photovoltaic cell 456 is arranged for photovoltage of an electrical potential of at least 0.6 Volt (or even at least 0.7 Volt) under illumination of this photovoltaic cell 456 of 100 mW/cm$^2$ for at least one wavelength comprised between 350 nm and 600 nm (or more generally between 10 nm and 1.4 µm), even at a zero bias voltage between the electrodes 3, 9 and/or even without the existence of electrode 3 and/or 9 and/or even at an initial zero bias voltage through this photovoltaic cell 456.

Figure 3:
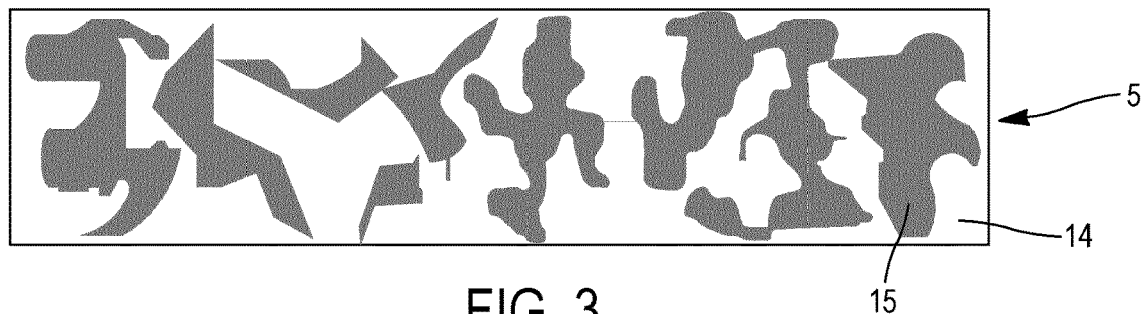
FIG. 3 is a side view of a part of a photosensitive layer 5 of the first embodiment of a spatial light modulator according to the invention.

As illustrated in FIG. 3, electron-donating molecules D, 15 and electron accepting molecules A, 14 are blended (i.e. in a blended state) and form a bulk D/A heterojunction layer.

The electron-donating molecules D are organic electron-donating molecules.

The electron accepting molecules A are organic electron accepting molecules.

In this description, organic matter, organic material, or organic molecule refer to carbon-based compounds preferably obtained by chemical synthesis. In particular, an organic molecule refers to a carbon-based molecule comprising carbon atoms linked together in rings and/or chains; these carbon atoms are preferably attached to other atoms of such elements as hydrogen, oxygen, and nitrogen.

The utilization of organic semiconductors 14, 15 allows more freedom in the design of the device 101 (flexibility, colour tuning, large area) and allows to use solution processing techniques to make the device according to the invention.

Contrary to inorganic semiconductors, the absorption of a photon by an organic semiconductor does not spontaneously generate free charges but gives rise to the formation of an exciton. These excitons have a very short lifetime, of the order of few ns and end up by recombining and by emitting a photon: the material is fluorescent. A D/A interface allows to dissociate the exciton into a pair of free charges, with opposing signs, before they recombine.

The photovoltaic cell 456 further comprises an inside interface layer 12 in contact with the photosensitive layer 5 of this photovoltaic cell 456, this inside interface layer 12 being located between the liquid crystal layer 7 and this photosensitive layer 5.

The inside interface layer 12 of the photovoltaic cell 456 is in contact with the liquid crystal layer 7 and is arranged for aligning the liquid crystal of the liquid crystal layer 7 at the interface between this inside interface layer 12 and the liquid crystal layer 7. Layer 12 has been brushed mechanically (at its face contacting layer 7) in order to be an alignment layer of the liquid crystal of layer 7.

The photovoltaic cell 456 further comprises an outside interface layer 13 in contact with the photosensitive layer 5 of this photovoltaic cell 456, this photosensitive layer 5 being located between the liquid crystal layer 7 and this outside interface layer 13.

The inside interface layer 12 in contact with a given photosensitive layer 5 of the same photovoltaic cell 456 and the outside interface layer 13 in contact with the same given photosensitive layer 5 of the same photovoltaic cell 456 are made of different materials.

The modulator 101 comprises two polarizers 1, 11.

Each polarizer 1, 11 is a WP25M-UB Ultra Broadband Wire Grid Polarizers (250 nm-4 µm) from Thorlabs.

Polarizers 1, 11 are crossed polarizers.

The modulator 101 comprises two substrates 2, 10.

Each substrate 2, 10 is a glass substrate.

The thickness of each substrate 2, 10 is more than 500 µm, typically around 1 mm.

The modulator 101 comprises two conductive layers or electrodes 3, 9.

Each electrode 3, 9 is a transparent conductive film.

Each electrode 3, 9 is made of Indium tin oxide (also called ITO).

There is not other electrode between the electrodes 3, 9.

The thickness of each electrode 3, 9 is less than 200 nm, typically around 140 nm.

The modulator 101 comprises an alignment layer 8.

Layer 8 has been brushed mechanically (at its face contacting layer 7) in order to be an alignment layer of the liquid crystal of layer 7.

The alignment layer 8 is a layer of Poly(3,4-ethylenedioxythiophene)-poly(styrenesulfonate) (also called PEDOT:PSS).

The alignment layer 8 has a thickness less than 100 nm, typically around 30 nm.

The liquid crystal layer 7 and the at least one photovoltaic cell 456 are comprised between the two polarizers 1, 11.

The liquid crystal layer 7 and the at least one photovoltaic cell 456 are comprised between the two substrates 2, 10.

The liquid crystal layer 7 and the at least one photovoltaic cell 456 are comprised between the two conductive layers or electrodes 3, 9.

The liquid crystal layer 7 is comprised between the two alignment layers 12, 8.

The two conductive layers or electrodes 3, 9 are comprised between the two substrates 2, 10.

The two conductive layers or electrodes 3, 9 are comprised between the two polarizers 1, 11.

The two substrates 2, 10 are comprised between the two polarizers 1, 11.

At least one photovoltaic cell 456 is in contact with one of the two conductive layers or electrodes 3, 9.

To maintain the two substrates 2, 10 (with layers 1, 3, 4, 5, 6, 8, 9, 11) at a certain distance, UV-curable glue mixed with calibrated microsphere (not illustrated) is used. The two substrates 2, 10 are glued together and a micrometric gap is formed, then the gap is filled by capillarity with liquid crystal 7. After that the gap is closed with UV-curable glue to seal the device 101.

One among the inside interface layer 12 and the outside interface layer 13 is an electron hole conducting layer 6 arranged for a transfer of an electron hole from its contacting photosensitive layer 5 easier than a transfer of an electron from its contacting photosensitive layer 5. The other one among the inside interface layer 12 and the outside interface layer 13 is an electron conducting layer 4 arranged for a transfer of an electron from its contacting photosensitive layer 5 easier than a transfer of an electron hole from its contacting photosensitive layer 5.

In the particular case of FIG. 1, the inside interface layer 12 is an electron hole conducting layer 6 arranged for a transfer of electron holes from its contacting photosensitive layer 5 easier than a transfer of electrons from its contacting photosensitive layer 5.

The electron hole conducting layer 6 is a layer of Poly(3,4-ethylenedioxythiophene)-poly(styrenesulfonate) (also called PEDOT:PSS).

The electron hole conducting layer 6 has a thickness less than 100 nm, typically around 30 nm.

In the particular case of FIG. 1, the outside interface layer 13 is an electron conducting layer 4 arranged for a transfer of electron from its contacting photosensitive layer 5 easier than a transfer of electron holes from its contacting photosensitive layer 5.

The electron conducting layer 4 is a layer of Polyethylenimine (also called PEI-E).

The electron conducting layer 4 has a thickness less than 100 nm or even less than 10 nm, typically around 7 nm.

The electron conducting layer 4 is a very thin layer (less than 10 nm thick, typically 7 nm thick) of an electrically insulating material (PEIE) but with intrinsic electrical dipoles. These dipoles make access to layer 3 difficult for electron holes, for good selectivity.

The interfaces between the photosensitive layer 5 and the adjacent materials 4, 6 have a considerable impact on the evolution of photo-generated charges. The layer 5 is comprised between two materials 4, 6, whose electronic work functions are different. Thus, the negative and positive charges generated in the layer 5 separate (the negative charges will accumulate preferentially at the interface with the material 4 with low work function and vice versa for the positive charges). This results in a difference in electrical potential $\Delta V$ between the two adjacent materials 4 and 5 or respectively 5 and 6 whose amplitude increases (a priori logarithmically) with the intensity of light. The "photovoltage" $\Delta V$ is equivalent to the "open circuit voltage" of a photovoltaic cell.

In a general manner, the photosensitive layer 5 (preferably combined with layer 4 and/or 6) is arranged (even at a zero bias voltage between the electrodes 3, 9 or even without the existence of layer 3 and/or 9, i.e. spontaneously or even at an initial zero bias voltage through layer 7 and/or through layer 5) for, under illumination of this photosensitive layer 5, being at the origin of a voltage drop across the liquid crystal layer 7 changing the orientation of the liquid-crystal molecules (and modifying the birefringence of layer 7).

Typically, the photosensitive layer 5 (preferably combined with layer 4 and/or 6) is arranged (even at a zero bias voltage between the electrodes 3, 9 or even without the existence of layer 3 and/or 9, i.e. spontaneously or even at an initial zero bias voltage through layer 7 and/or through layer 5) for, under illumination of this photosensitive layer 5 of 100 mW/cm$^2$ for at least one wavelength comprised between 350 nm and 600 nm (or more generally between 10 nm and 1.4 µm), being at the origin of a voltage drop of at least the Fredericks threshold voltage of the crystal liquid of the crystal liquid layer 7 (which can be as low as 0.6V) across the liquid crystal layer 7 changing the orientation of the liquid-crystal molecules (and modifying the birefringence of layer 7), i.e typically of at least 0.6 V (or even at least 0.7V) across the liquid crystal layer 7.

Under illumination, and provided that the layers 3 and 9 are electrically connected, the organic layer 5 is at the origin of a voltage drop across the liquid crystal layer 7, thereby changing the orientation of the liquid-crystal molecules, and modifying the birefringence of layer 7. As a consequence, when the device 101 is placed between two crossed polarizers 1, 11, the birefringence change translates into a variation of the transmittance of the device 1. The response of liquid crystal layer 7 to light exposure depends on the relative orientations of the alignment layers 12, 8: liquid crystal layer 7 can be either twisted-nematic or a planar cell. It varies with the light intensity and therefore follows the spatial distribution of the incident light intensity. The liquid crystal of layer 7 is:

a twisted nematic liquid crystal (if the alignment layers 12, 8 are orthogonal): this configuration is used to turn "on" or off" each area of the modulator 101 depending on the light intensity and wavelength received by each area, or a planar nematic liquid crystal (if the alignment layers 12, 8 are parallel): this configuration is used to modify the polarization of light crossing each area of the modulator 101 depending on the light intensity and wavelength received by each area.

All the absolute or relative numerical values of this description are given by default for a temperature of 20° C. and a pressure of 1 bar.

In this description:

HOMO of a molecule refers to the energy level of the highest occupied molecular orbital of this molecule.

LUMO of a molecule refers to the energy level of the lowest unoccupied molecular orbital.

ionization potential (or ionization energy (IE)) is the amount of energy required to remove the most loosely bound electron, (from the HOMO orbital) of an isolated molecule to form a cation.

electron Affinity (EA) is the amount of energy released or spent when an electron is added to a neutral molecule to form a negative ion.

work function (Wf) is the minimum thermodynamic work needed to remove an electron from a solid to a point in the vacuum immediately outside the solid surface.

As illustrated in FIG. 5, the absolute value of the energy difference between the work function of the electron conducting layer 4 and the electron affinity of each electron accepting molecule of the photosensitive layer 5 contacting this outside interface layer 13 is less than or equal to 0.2 eV. This enhances the capacity of layer 4 to attract electrons from layer 5 and to conduct electrons compared to its capacity to attract electron holes form layer 5 and to conduct electron holes.

As illustrated in FIG. 5, the absolute value of the energy difference between the work function of the electron hole conducting layer 6 and the ionization potential of each electron-donating molecule of the photosensitive layer 5 contacting this inside interface layer 12 is less than or equal to 0.2 eV. This enhances the capacity of layer 6 to attract electron holes from layer 5 and to conduct electron holes compared to its capacity to attract electrons from layer 5 and to conduct electrons.

The liquid crystal layer 7 has an electrical resistance higher than each part or layer of the photovoltaic cell 456, and even higher than each part or layer comprised between the electrodes 3, 9. The liquid crystal layer 7 has an electrical resistance at least two times higher than each part or layer 4, 5, 6 of the photovoltaic cell 456, and even at least two times higher than each part or layer comprised between the electrodes. The electrical resistance of each layer respectively 7, 4, 5, 6, 8 is measured perpendicularly to this layer respectively 7, 4, 5, 6, 8 that is parallel to the thickness of each layer respectively 7, 4, 5, 6, 8, the thickness being the smaller spatial dimension of each layer respectively 7, 4, 5, 6, 8.

EA(A) is the electron affinity of each electron accepting molecule expressed in eV EA(D) is the electron affinity of each electron donating molecule expressed in eV IE(A) is the ionization potential of each electron accepting molecule expressed in eV IE(D) is the ionization potential of each electron-donating molecule expressed in eV The energy difference between the electron affinity and the ionization potential of each electron-donating molecule (that is for only one molecule D) is preferably higher than or equal to 3 eV: $EA(D)-IE(D) \gtrsim 3$ eV. This allows modulator 101 to be transparent in the visible range (in its «off state»), for instance for smart windows applications. This is not the case in the particular case of the embodiment of FIG. 5.

The energy difference between the electron affinity and the ionization potential of each electron accepting molecule (that is for only one molecule A) is preferably higher than or equal to 3 eV: $EA(A)-IE(A) \gtrsim 3$ eV. This allows modulator 101 to be transparent in the visible range (in its «off state»), for instance for smart windows applications. This is not the case in the particular case of the embodiment of FIG. 5.

Nevertheless, some molecules such as C60 derivatives (such as PCBM) absorb almost no visible light even though the bandgap value is less than 3 eV (due to the spherical symmetry of these molecules). For example, only the material D (polymer or small molecule) can respect the limit of 3 eV, for example for D/A mixtures where the acceptor molecules A are a derivative of C60.

As illustrated in FIG. 5, the energy difference between the electron affinity of the electron-donating molecules and the electron affinity of the electron accepting molecules is higher than or equal to 0.1 eV $(EA(D)=EA(A) \gtrsim 0.1$ eV), preferably higher than or equal to 0.3 eV $(EA(D)=EA(A) \gtrsim 0.3$ eV), per couple of electron-donating molecule and electron accepting molecule. The combination of such molecules 14, 15 allows the generation of free electrical charges in layer 5 following the absorption of UV photons in layer 5.

As illustrated in FIG. 5, the energy difference between the ionization potential of the electron-donating molecules and the ionization potential of the electron accepting molecules is higher than or equal to 0.1 eV $(IE(D)-IE(A) \gtrsim 0.1$ eV), preferably higher than or equal to 0.3 eV $(IE(D)-IE(A) \gtrsim 0.3$ eV), per couple of electron-donating molecule and electron accepting molecule. The combination of such molecules 14, 15 allows the generation of free electrical charges in layer 5 following the absorption of UV photons in layer 5.

As illustrated in FIG. 5, the energy difference between the electron affinity of the electron accepting molecules and the ionization potential of the electron-donating molecules, per couple of electron-donating molecule and electron accepting molecule, respects the following equation:

$$IE(D)-EA(A) \gtrsim V(Fredericks) \times e + 0.3$$

where:

EA(A) is the electron affinity of each electron accepting molecule expressed in eV IE(D) is the ionization potential of each electron-donating molecule expressed in eV V(Fredericks) is the Fredericks threshold voltage, expressed in V, of the crystal liquid of the crystal liquid layer 7 (i.e. the threshold voltage from which the liquid crystal change their orientation)

e is the charge of an electron expressed in C.

Then the generation of charges in layer 5 results in a phototension of the same order of magnitude as the Fredericks voltage of the liquid crystal As illustrated in FIG. 5, the ionization potential of each electron-donating molecule is higher than or equal to 5 eV. This allows enhancing the stability of the modulator 101 in the presence of oxygen or water vapor.

As illustrated in FIG. 5, the electronic affinity of each electron accepting molecule is higher than or equal to 3.5 eV.

This allows enhancing the stability of the modulator 101 in the presence of oxygen or water vapor.

The liquid crystal layer 7 and the at least one photovoltaic cell 456 are comprised between the two polarizers 1, 11.

The thickness of each photovoltaic cell 456 is less than 1 µm.

Modulator 101 has thus a glass/ITO/PEIE/P3HT:PCBM/PEDOT:PSS/E7/PEDOT:PSS/ITO/glass structure. Its manufacturing process is the following. Indium tin oxide (ITO) coated glass slides were used as transparent conducting electrode. The ITO coated glass slides were cleaned by successive sonication for 15 minutes each in acetone, isopropanol, deionized water. The ITO slides were then UV ozone treated prior to the organic layer deposition. PEDOT:PSS (Clevios PH, Heraeus), a conductive polymer, was filtered through a 0.22 µm filter to remove aggregates, spin-coated onto the ITO coated glass slides in ambient conditions, transferred to a glovebox with an inert nitrogen atmosphere(<1 ppm $0_2$ and $H_2O$ ), and dried for 30 min at 140° C. For the photoactive layer, a solution of P3HT (>93% regioregular, Solaris Chem) and PCBM (Solenne BV) in chlorobenzene with a (1:1) weight ratio was prepared and stirred overnight at 60° C. Prior to P3HT:PCBM layer deposition, the ITO was modified by spin-coating a PEIE solution (polyethylenimine, 80% ethoxylated solution, 35-40 wt. % in $H_2O$, average Mw=70000) purchased from Sigma-Aldrich that has been further diluted with 2-methoxyethanol (with a weight ratio of 0.6%) also purchased from Sigma-Aldrich. The PEIE solution was spin-coated onto the ITO coated glass slide in ambient conditions, transferred to a glovebox with an inert nitrogen atmosphere (<1 ppm $0_2$ and $H_2O$ ), and dried for 10 min at 100° C. The photoactive layer was then spin-coated on the ITO modified substrate and dried for 10 min at 140° C. Finally, a thin layer of PEDOT:PSS (Clevios CPP 105 D or HTL Solar, Heraeus) was spin-coated on top of the photoactive layer in ambient atmosphere, transferred to a glovebox with an inert nitrogen atmosphere (<1 ppm $0_2$ and $H_2O$ ), and dried for 5 min at 120° C.

The coated layers were then rubbed by use of a velvet cloth attached to a rotating drum in order to induce the alignment of the liquid crystal molecules along the rubbing direction in the final device. A mixture of adhesives (UV curable glue, Loctite AA350) and spacer (7.75 µm $SiO_2$ Microspheres) were used to create a cell gap between the PEDOT:PSS coated and P3HT:PCBM/PEDOT:PSS coated glass slides. The adhesive was cured by exposing the substrates to UV light for 5 minutes. Then the empty cell was filled with a liquid crystal mixture known as E7 by capillarity on a hot plate at 65° C. Finally, the edges of the cell were sealed with an epoxy resin (Araldite) to avoid contamination. A summary diagram of the final cell is shown below.

Figure 4:
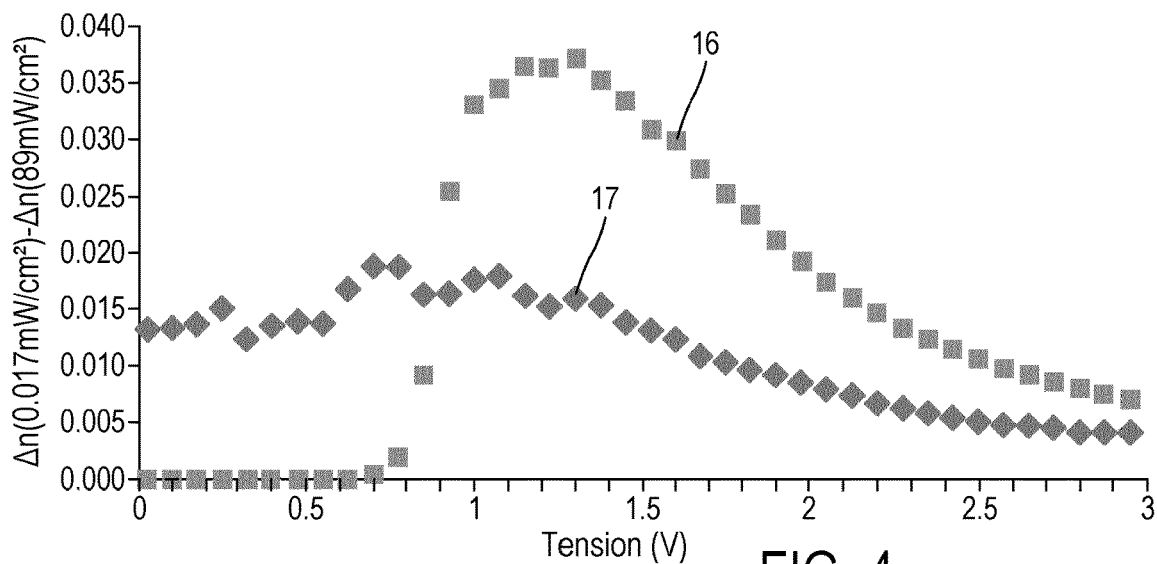

Modulator 101 behaves like a photovoltaic OASLM, with a change in birefringence Δn (variation of the refractive index under illumination with 89 mW/cm² optical power) of ~0.04 at 1.3 $V_{RMS}$ (frequency f=100 Hz), as illustrated by curve 16 of FIG. 4. For modulator 101 there is no variation in birefringence in the absence of external polarization, because the photovoltage is too small to reorient the liquid crystal of layer 7 without the contribution of an external polarization between electrodes 3,9. Modulator 101 makes it possible to obtain an optical response at a much higher frequency (AC) than the PVK: C60 mixture according to prior art, thus avoiding the problem of flicker according to prior art.

In a second variant (not illustrated) of modulator 101, the inside interface layer 12 is directly the liquid crystal layer 7.

Layer 5 has been brushed mechanically (at its face contacting layer 7) in order to be an alignment layer of the liquid crystal of layer 7. The photosensitive layer 5 is thus arranged for aligning the liquid crystal of the liquid crystal layer 7 at the interface between this photosensitive layer 5 and the liquid crystal layer 7.

The photosensitive layer 5 is hydrophobic. This cause a larger "pretilt" angle of the liquid crystal of layer 7, and thus allows a change in birefringence Δn at zero bias voltage.

This second variant of modulator 101 has thus a glass/ITO/PEIE/P3HT:PCBM/E7/PEDOT:PSS/ITO/glass structure.

The upper (brushed) region of layer 5 plays the role of the electron hole conducting layer 6 (but in another variant layer 13 can be the electron hole conducting layer 6 and layer 5 plays the role of the electron conducting layer 4).

This second variant of modulator 101 behaves like a photovoltaic OASLM, with a change in birefringence Δn (variation of the refractive index under illumination) of Δn~0.014 et 0 V and Δn~0.019 to 0.7 V V$_{RMS}$ (frequency f=1 kHz), as illustrated by curve 17 of FIG. 4. The non-zero response to 0V is an indisputable signature of the photovoltaic mode.

In a third variant (not illustrated) of modulator 101, the inside interface layer 12 in contact with the liquid crystal layer 7 is hydrophobic. This also allows a non-zero response to 0V.

Curves 16, and 17 of FIG. 4 clearly show that the sensitivity to the incident light is greatly improved according to the invention compared to prior art. The effect is multiplied by the superposition or multiplication of photovoltaic cells 456.

We are now going to describe, in reference to FIG. 6, a second embodiment 102 of a spatial light modulator according to the invention, but only for its differences compared to the first embodiment 101 of FIGS. 1 to 5.

The at least one photovoltaic cell 456 comprises, on at least one side of the liquid crystal layer 7, a superposition of a plurality of contacting photovoltaic cells 456.

All the cell 456 are similar and comprises layer 4,13 plus layer 5 plus layer 6,12 as previously described in reference to FIGS. 1 to 5.

With two photovoltaic cells 456, the obtained phototension is equal or higher than 1.2 V and is sufficient to reorient the liquid crystal E7 of layer 7 that have a threshold voltage of 1V without the contribution of an external polarization, and there is a variation in birefringence in the absence of external polarization.

We are now going to describe, in reference to FIG. 7, a third embodiment 103 of a spatial light modulator according to the invention, but only for its differences compared to the first embodiment 101 of FIGS. 1 to 5.

The spatial light modulator 103 comprises, on each side of the liquid crystal layer 7, at least one photovoltaic cell 456.

All the cell 456 are not similar:
on one side of the liquid crystal 7, each cell 456 comprises layer 4,13 plus layer 5 plus layer 6,12 as previously described in reference to FIGS. 1 to 5: on this side, each outside interface layer 13 is an electron conducting layer 4 and each inside interface layer 12 is an electron hole conducting layer 6; one of the inside interface layer 12 (contacting the layer 7) is arranged for aligning the liquid crystal of the liquid crystal layer 7 at the interface between this inside interface layer 12 and the liquid crystal layer 7;

on the other side of the liquid crystal 7, each cell 456 comprises layer 4,12 plus layer 5 plus layer 6,13: on this other side, each inside interface layer 12 is an electron conducting layer 4 and each outside interface layer 13 is an electron hole conducting layer 6; one of the inside interface layer 12 (contacting the layer 7) is arranged for aligning the liquid crystal of the liquid crystal layer 7 at the interface between this inside interface layer 12 and the liquid crystal layer 7.

With a high enough number of photovoltaic cells 456, the obtained phototension is sufficient to reorient the liquid crystal of layer 7 without the contribution of an external polarization, and there is a variation in birefringence in the absence of external polarization.

According to the invention, the utilization of an organic D/A blend (layer 5) which, when associated with appropriate interfaces 4, 6, yields a spontaneous photovoltage under illumination. This differs from the response of the commonly used inorganic semiconductor thin films (e.g. amorphous Si) or previously investigated organic photosensitive layers (PVK:C60) according to prior art, for which light exposure results only in a change in electrical conductance. Unlike the latter case according to prior art, for which a voltage needs to be applied across the device according to prior art in order to induce an electric field strength in the liquid crystal and reorient the liquid crystal molecules, the new device according to the invention works also at zero voltage bias. Moreover, since the organic photosensitive layer is deposited from solution at room temperature, large area flexible devices may in principle be developed at low cost. According to the invention, avoiding high temperature processing should reduce the processing costs and give rise to new opportunities to apply OASLMs. The possibility according to the invention to operate at zero bias reduces the power consumption of the device and gives rise to new application opportunities.

The potential applications are for example:
window (glass) with self-adaptive transparency;
beam deflection devices (through refractive index grating);
sensitive device protection (reduced transparency in case of high intensity incident light);
protective googles (similar to photochromic glasses but with quasi-instantaneous and fully reversible response);
light intensity controlled protection of sensitive equipment;
adaptive optical components (lenses, waveplates—through refractive index gratings);
wavelength selective light switches.

Of course, the invention is not limited to the examples which have just been described and numerous amendments can be made to these examples without exceeding the scope of the invention.

In variants of all the previously described embodiments:
the spatial light modulator according to the invention comprises, on each side of the liquid crystal layer 7, a superposition of a plurality of photovoltaic cells 456. That is for example the case of the combination of embodiments 102 and 103; and/or
the energy difference between the electron affinity and the ionization potential of each electron-donating molecule is smaller or higher than 3 eV and/or the energy difference between the electron affinity and the ionization potential of each electron accepting molecule is smaller or higher than or equal to 3 eV. This allows modulator according to the invention to operate in the infra-red range, or to be semi-transparent in the visible range; and/or
the photosensitive layer 5 is a bi-layer instead of a bulk heterojunction. Generally, a first layer of P3HT (or PCBM) is deposited, then a second layer of PCBM (or respectively P3HT) is deposited; and/or
a supplementary alignment layer can be added between a layer 12 and the liquid crystal layer 7; and/or
the electron conducting layer 4 can also be a high-gap semiconductor (>3 eV), whose conduction band is close to the LUMO of the electron accepting molecule A: for example a thin layer of ZnO, obtained from chemical precursors, or $TiO_2$; and/or
molecules 14 and/or 15 may be changed, in particular in order to enhance the photovoltage (and thereby the response of the device 101, 102, 103 at zero bias; this way it is possible to obtain, with only one cell 456, a phototension sufficient to reorient the liquid crystal of layer 7 without the contribution of an external polarization, and thus a variation in birefringence in the absence of external polarization) and/or to modify its spectral response (typically from near infra-red to ultra violet light, i.e for a wavelength comprised between 10 nm to 1.4 µm); the electron donating molecules D can for example be poly[N-9'-heptadecanyl-2,7-carbazole-alt-5,5-(4,7-di-2-thienyl-2',1',3'-benzothiadiazole]
(also called PCDTBT) and/or the electron accepting molecules A can for example be 1',1",4',4"-Tetrahydro-di[1,4]methanonaphthaleno[1,2:2',3',56,60:2",3"][5,6] fullerene-C60 (also called ICBA); and/or
polarizers 1, 11 are optional in particular if layer 7 comprises an "intelligent" liquid crystal such like liquid crystal having a guest dichroic dye dispersed there through (patent ref: WO1999067681 A1); and/or
substrate 2 and/or 10 can be made with another material, for example from a film of polyethylene terephthalate (also called PET); and/or
conductive layer 3 and/or 9 can be made with another material, for example with a PEDOT:PSS film; and/or
conductive layer 3 and/or 9 is optional, in particular if device 101, 102, 103 is designed for working at 0 bias voltage and/or if one or more layer among layers 2, 8, 10 is connected to an electrical ground and/or plays the role of an electrode; the modulator according to the invention may comprise electrode 3 (preferably without any other electrode) or electrode 9 (preferably without any other electrode) or electrodes 3 and 9 (preferably without any other electrode) and/or
layer 4 can be made with another material, for example with ZnO or other polyelectrolytes; and/or
layer 6 can be made with another material, for example with $MoO_3$; and/or
liquid crystal of layer 7 can be made with another material, in particular any type of nematic liquid crystal showing a birefringence, preferably with a liquid crystal having a low control voltage; Liquid crystal of layer 7 can for example be made with TL205 liquid crystal (which is a mixture of cyclohexane-fluorinated biphenyls and fluorinated terphenyls); and/or
layer 8 can be made with another material, for example with polyimide; and/or
the photosensitive layer (5) comprising electron-donating (D) molecules and electron accepting (A) molecules can be a ternary mixture; and/or layer 13 can be merged with another layer 3, 2, 1 or other; and/or in layer 5, the mass ratio between electron-donating molecules D, 15 and electron accepting molecules A can vary from 1:3 to 3:1 or any other values.

Of course, the different characteristics, forms, variants and embodiments of the invention can be combined with each other in various combinations to the extent that they are not incompatible or mutually exclusive. In particular all variants and embodiments described above can be combined with each other.

The invention claimed is:

1. A liquid crystal spatial light modulator comprising:
    a liquid crystal layer comprising liquid-crystal molecules; and
    on at least one side of the liquid crystal layer, at least one photovoltaic cell, each photovoltaic cell comprising a photosensitive layer comprising electron-donating molecules and electron accepting molecules, each photovoltaic cell generating spontaneous photovoltage under illumination at zero voltage bias,
    wherein the photosensitive layer is arranged such that illumination of said photosensitive layer causes a voltage drop across the liquid crystal layer, between said at least one photovoltaic cell and an electrode on an opposite side of the liquid crystal layer, thereby changing the orientation of the liquid-crystal molecules and modifying the birefringence of the liquid crystal layer.

2. A spatial light modulator according to claim 1, characterized in that electron-donating molecules and electron accepting molecules are in a blended state and form a bulk heterojunction layer or in a bi-layer state.

3. A spatial light modulator according to claim 1, characterized in that the electron-donating molecules are organic electron-donating molecules.

4. A spatial light modulator according to claim 1, characterized in that the electron accepting molecules are organic electron accepting molecules.

5. A spatial light modulator according to claim 1, characterized in that the at least one photovoltaic cell comprises, on at least one side of the liquid crystal layer, a superposition of a plurality of photovoltaic cells.

6. A spatial light modulator according to claim 1, comprising, on each side of the liquid crystal layer, at least one photovoltaic cell.

7. A spatial light modulator according to claim 1, characterized in that the or each or at least one photovoltaic cell further comprises an inside interface layer, this inside interface layer:
    being in contact with the photosensitive layer of this photovoltaic cell, this inside interface layer being located between the liquid crystal layer and this photosensitive layer, or
    being the liquid crystal layer.

8. A spatial light modulator according to claim 7, characterized in that the inside interface layer is an electron hole conducting layer arranged for a transfer of electron holes from a contacting photosensitive layer of the inside interface layer easier than a transfer of electrons from a contacting photosensitive layer of the inside interface layer.

9. A spatial light modulator according to claim 7, characterized in that the inside interface layer of the or one of the photovoltaic cell:
    is in contact with the liquid crystal layer, the inside interface layer being arranged for aligning the liquid crystal of the liquid crystal layer at the interface between this inside interface layer and the liquid crystal layer, or
    is the liquid crystal layer, and the photosensitive layer of this photovoltaic cell is arranged for aligning the liquid crystal of the liquid crystal layer at the interface between this photosensitive layer and the liquid crystal layer.

10. A spatial light modulator according to claim 9, characterized in that the inside interface layer:
    is in contact with the liquid crystal layer, and is hydrophobic, or
    is the liquid crystal layer, and the photosensitive layer of this photovoltaic cell is hydrophobic.

11. A spatial light modulator according to claim 1, characterized in that the or each or at least one photovoltaic cell further comprises an outside interface layer in contact with the photosensitive layer of this photovoltaic cell, this photosensitive layer being located between the liquid crystal layer and this outside interface layer.

12. A spatial light modulator according to claim 11, characterized in that the outside interface layer is an electron conducting layer arranged such that a transfer of electrons from a contacting photosensitive layer of the outside interface layer occurs more readily than a transfer of electron holes from a contacting photosensitive layer of the outside interface layer.

13. A spatial light modulator according to claim 1, characterized in that the or each or at least one photovoltaic cell comprises both of:
    an inside interface layer,
    an outside interface layer,
    the inside interface layer in contact with a given photosensitive layer and the outside interface layer in contact with the same given photosensitive layer being made of different materials.

14. A spatial light modulator according to claim 13, characterized in that:
    one among the inside interface layer and the outside interface layer is an electron hole conducting layer arranged for a transfer of an electron hole from its contacting photosensitive layer easier than a transfer of an electron from its contacting photosensitive layer
    the other one among the inside interface layer and the outside interface layer is an electron conducting layer arranged for a transfer of an electron from its contacting photosensitive layer easier than a transfer of an electron hole from its contacting photosensitive layer.

15. A spatial light modulator according to claim 14, characterized in that the absolute value of the energy difference between the work function of the electron conducting layer and the electron affinity of each electron accepting molecule of the photosensitive layer contacting this outside interface layer is less than or equal to 0.2 eV.

16. A spatial light modulator according to claim 14, characterized in that the absolute value of the energy difference between the work function of the electron hole conducting layer and the ionization potential of each electron-donating molecule of the photosensitive layer contacting this inside interface layer is less than or equal to 0.2 eV.

17. A spatial light modulator according to claim 1, characterized in that the liquid crystal layer has an electrical resistance higher than each part of the photovoltaic cell(s).

18. A spatial light modulator according to claim 1, characterized in that the energy difference between the electron affinity and the ionization potential of each electron-donating molecule is higher than or equal to 3 eV.

19. A spatial light modulator according to claim 1, characterized in that the energy difference between the electron affinity and the ionization potential of each electron accepting molecule is higher than or equal to 3 eV.

20. A spatial light modulator according to claim 1, characterized in that the energy difference between the electron affinity of the electron-donating molecules and the electron affinity of the electron accepting molecules is higher than or equal to 0.1 eV per couple of electron-donating molecule and electron accepting molecule.

21. A spatial light modulator according to claim 1, characterized in that the energy difference between the electron affinity of the electron-donating molecules and the electron affinity of the electron accepting molecules is higher than or equal to 0.3 eV per couple of electron-donating molecule and electron accepting molecule.

22. A spatial light modulator according to claim 1, wherein the photovoltaic cell comprises an organic layer which is in contact with the liquid crystal layer.

23. A spatial light modulator according to claim 22, wherein said organic layer which is in contact with the liquid crystal layer is a conducting layer or a semiconducting layer.

24. A spatial light modulator according to claim 1, wherein said illumination of said photosensitive layer causes a voltage drop across the liquid crystal layer greater than the Fredericks threshold voltage of the liquid crystal layer.

* * * * *